United States Patent [19]

Kawashima

[11] Patent Number: 4,900,971
[45] Date of Patent: Feb. 13, 1990

[54] FACE SHEAR MODE QUARTZ CRYSTAL RESONATOR

[75] Inventor: Hirofumi Kawashima, Sendai, Japan

[73] Assignee: Seiko Electronic Components Ltd., Japan

[21] Appl. No.: 320,157

[22] Filed: Mar. 7, 1989

[30] Foreign Application Priority Data

Mar. 10, 1988 [JP] Japan .................................. 63-57106
Mar. 10, 1988 [JP] Japan .................................. 63-57109
Mar. 22, 1988 [JP] Japan .................................. 63-67819

[51] Int. Cl.[4] ........................................... H01L 41/08
[52] U.S. Cl. .................................. 310/361; 310/367; 310/368
[58] Field of Search ............... 310/361, 367, 368, 348, 310/346

[56] References Cited

U.S. PATENT DOCUMENTS 4,313,071 1/1982 Hermann et al. ............... 310/367 X
4,350,918 9/1982 Sato ................................. 310/361 X
4,355,257 10/1982 Kawashima et al. ........... 310/367 X Primary Examiner—Mark O. Budd
Attorney, Agent, or Firm—Bruce L. Adams; Van C. Wilks

[57] ABSTRACT

A face shear mode quartz crystal resonator having a vibrational portion and supporting portions incorporated therein by an etching method. A flexural portion of the supporting portion is connected with a central portion of a side of the vibrational portion. The width W and length L of the flexural portion connected with the vibrational portion are designed so as to meet "$W \leq 0.67L$". The supporting portions are provided at the edges in the $z'$-axis direction of the vibrational portion which is substantially square and fixedly supported via both distal end portions of the supporting portions, and each side of the vibrational portion is from 0.72 mm to 2.02 mm.

1 Claim, 2 Drawing Sheets

FACE SHEAR MODE QUARTZ CRYSTAL RESONATOR

BACKGROUND OF THE INVENTION

The background on which the present invention has been devised will first be described. In the field of consumer products and communication equipment, much effort has been paid positively to enhance the degree of miniaturization and preciseness. Especially, quartz crystal resonators used in such devices must be miniaturized, and quartz crystal units of a surface mounting type are required to generate frequencies of 1.5 MHz to 4.2 MHz. The present invention has been devised in view of the foregoing circumstances. That is, the quartz crystal resonator of the present invention is one usable as a reference signal source of various devices, such as consumer products and communication equipment; or, the present invention relates to a face shear mode quartz crystal resonator adapted to fabricate the surface mounting type which has a vibrational portion and supporting portions formed by an etching method.

The conventional face shear mode quartz crystal resonator is shaped by machining and generally it is supported by two thin lead wires attached to the center of a square plate. Therefore, the conventional resonator is difficult to minaturize and weak with respect to shock and exhibits a large energy loss caused by vibration at supporting points; accordingly, no face shear mode quartz crystal resonator could be fabricated that has a small motional series resistance $R_1$ and a large quality factor. Further, in view of the foregoing method of support, the conventional face shear mode quartz crystal resonator fabricated through machining is limited in terms of miniaturization when produced in large quantity, and with the realizable size of the resonator, the frequency is limited to 500KHz at best, or frequencies higher than the above can hardly be attained. On the other hand, the process of incorporating the vibrational portion and supporting portions in the quartz crystal resonator using the etching method adopted in the present invention is adopted also in Japanese Patent Publication Nos. 58-47883 and 61-44408, Japanese Patent Laid-Open No. 53-132988, U.S. Pat. Nos. 4,350,918, 4,447,753, 4,484,382 and 4,633,124, etc., these disclosing GT cut quartz crystal resonators involving two width-extensional and length-extensional modes. This process is known as being adapted for use as the method of fabricating a quartz crystal resonator. Therefore, the present invention has applied the etching method well known in the art to the face shear mode quartz crystal resonator of the present invention to overcome the foregoing defects. Although the shape of the face shear mode quartz crystal resonator of the present invention is analogous to those of the resonators disclosed in the above-mentioned patents, the vibration mode of the resonator of the present invention differs intrinsically from those of the prior patents, and the way of thinking to determine the shape and size of the resonator differs basically from that of the prior art.

SUMMARY OF THE INVENTION

It is an object of the present invention to provide a face shear mode quartz crystal resonator having superior electrical characteristics, such as a very small energy loss caused by vibration, a small motional series resistance $R_1$ and a high quality factor. It is another object of the present invention to provide a face shear mode quartz crystal resonator which gives a frequency of 1.5 MHz to 4.2 MHz and is small in size and excellent in shock-resistance. It is still another object of the present invention to provide a face shear mode quartz crystal resonator which exhibits a small variation in frequency with respect to a temperature change. The quartz crystal is a substance which is very stable physically and chemically; therefore, from which a socalled quartz crystal resonator can be fabricated that has a small motional series resistance and a large quality factor. However, such superior characteristics can be attained only through adopting such a manner of designing the shape of a resonator as giving a small energy loss caused by vibration. The present invention has devised and improved, in a face shear mode quartz crystal resonator having a vibrational portion and supporting portions incorporated therein by an etching method, the location and size of the supporting portion so that the vibration of the vibrational portion cannot be suppressed; thus, there can be obtained a face shear mode quartz crystal resonator having a small motional series resistance $R_1$ and a high quality factor. Further, since the face shear mode quartz crystal resonator of the present invention has the vibrational portion and supporting portions incorporated therein by the etching method, the overall size can be miniaturized and the frequency can be increased to as high as 1.5 MHz to 4.2 MHz, compared with the conventional resonators. Further, since the resonator is fixedly supported on a pedestal or the like via distal end portions of the supporting portions, it becomes excellent in shock-resistance. Further, since a zero temperature coefficient is attained through selection of a cut angle being applied to a plate of quartz crystal, there can be obtained a quartz crystal resonator of superior frequency temperature characteristics. As pointed out above, the face shear mode quartz crystal resonator of the present invention is superior at various points of view.

DETAILED DESCRIPTION OF PREFERRED EMBODIMENTS

The results obtained in the present invention will now be described in greater detail.

Figure 3A:
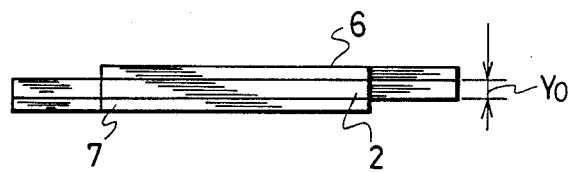
FIGS. 3a and 3b are a side view and a plan view, respectively, of a model for explanation of the fundamentals of the face shear mode quartz crystal resonator of the present invention.
Figure 3B:
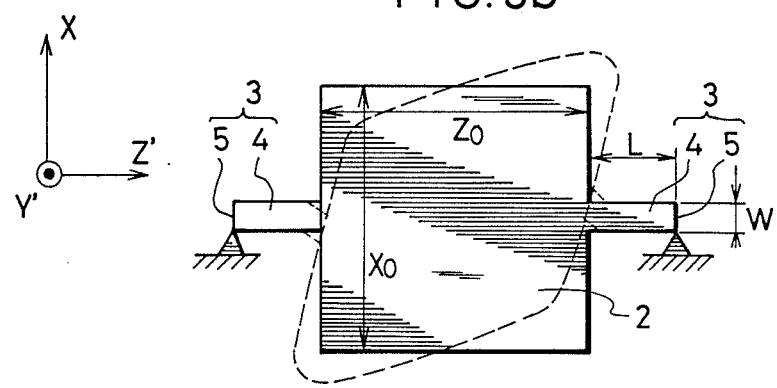

FIG. 3 is a diagram of a modified resonator for explanation of the fundamentals of the face shear mode quartz crystal resonator of the present invention. A resonator 1 comprises a vibrational portion 2 and supporting portions 3, the supporting portion 3 comprises at least a flexural portion 4 and a mounting portion 5, and the supporting portion is considered to be secured under the boundary condition of one-end supporting. The vibrational portion 2 has a length $x_o$, a width $z_o$ and a thickness $y_o$, and the flexural portion 4 of the supporting portion 3 has a length L and a width W. When an electric field is applied to upper-side and under-side electrodes 6 and 7 of the vibrational portion 2, the vibrational portion 2 of the resonator 1 causes a face shear mode displacement a illustrated by the broken line, and at the same time, the flexural portion 4 of the supporting portion 3 also exhibits a displacement as illustrated by the broken line. Reversely, when an opposite electric field is applied to the vibrational portion 2, it goes without saying that expansion and contraction displacements appear in opposite directions. That is, according to the present invention, the face shear displacement of the vibrational portion 2 is converted into a flexural mode at the supporting portion 3 so as not to suppress the degree of freedom of the vibration of the vibrational portion 2. In practice, there is a certain size which does not suppress the vibration. The shape or size for such purposes is determined by the potential energy of the vibrational portion 2 and of the flexural portion 4 of the supporting portion 3. That is, taking $U_1$ as the potential energy of the vibrational portion 2 and $U_2$ as the potential energy of the flexural portion 4, the $U_1$ and $U_2$ are expressed by the following equations:

$$U_1 = \frac{1}{2} \int_{v_1} T_5 S_5 \, dv \quad (1)$$

$$U_2 = \frac{1}{2} \int_{v_2} E I \left( \frac{\partial^2 u}{\partial z^2} \right)^2 dv \quad (2)$$

where $T_5$ is a stress, $S_5$ is a strain, E is a Young's modulus, I is a moment of inertia, u is a displacement, $v_1$ is a volume, $v_2$ is a volume, and z is an axis of coordinate system. Further, the relationship not suppressing the vibration of the face shear mode quartz crystal resonator is given from the equations (1) and (2) as follows:

$$U_1 > U_2 \quad (3)$$

With the foregoing, the dimensions L and W of the flexural portion 4 can be determined. For example, when the frequency of the resonator of the present invention is to be f=1.84 MHz, the dimensions of the vibrational portion are such that the length is $x_o = z_o = 1.65$ mm and the plate thickness is $y_o = 50$ μm ( here, although the plate thickness $y_o$ gives substantially no influence to the frequency, it influences the machinability in etching and the elimination of spurious vibration; thus, $y_o = 50$ μm is chosen ). In this case, if the width W of the flexural portion of the supporting portion is smaller than 0.67L, the vibration of the vibrational portion 2 is not suppressed; accordingly, there can be obtained the face shear mode quartz crystal resonator of superior electrical characteristics, or having a small motional series resistance $R_1 \approx 100$ Ω, and a large quality factor of about 150,000. Although the foregoing example has been described as having a frequency of f=1.84 MHz, when the frequency is to be from 1.5 MHz to 4.2 MHz, each side ($x_o = z_o$) of the vibrational portion becomes as small as 2.02 mm to 0.72 mm and the overall size inclusive of the supporting portions becomes no greater than 5 mm; accordingly, there can be obtained the face shear mode quartz crystal resonator of miniature size. Further, since both distal ends of the supporting portions are mounted to a body of ceramics or the like, there can be obtained the quartz crystal resonator very resistant to shock. The reason why the supporting portions of the face shear mode quartz crystal resonator of the present invention are aligned in the z'-axis direction is that with such alignment, the thermal expansion coefficient of a pedestal made of ceramics takes a value comparatively close to that of the quartz crystal resonator; consequently, the influence of the temperature on the frequency becomes very small, so that there can be obtained the face shear mode quartz crystal resonator of stable property. Further, the cut angle θ which brings about the zero temperature coefficient is obtained by rotating a Y plate about the x axis through an angle of θ=37°. The energy loss caused by vibration will now be described. As will be appreciated from the modified diagram of FIG. 3, the vibration energy of the vibrational portion 2 is transferred to the supporting portions 3. Accordingly, it is sufficient to make small the energy loss at the flexural portions 4 of the supporting portions 3. Since the mode of the supporting portion 3 is converted into the flexural mode, if the mass of a portion to be mounted of the one-end supporting portion is infinitely large, the energy of the flexural portion 4 of the supporting portion 3 never leaks. However, the foregoing condition does not hold for all types of resonant system of the resonator; but it holds where the vibration is symmetrical. In other words, the foregoing condition holds if the resonant system causes the vibration of the resonator readily and produces stable vibration. According to the present invention, one resonant system is made up by the supporting portions connected with the central portions of the sides of the vibrational portion and provided symmetrically at both edges of the vibrational portion. With this configuration, a symmetrical mode can be caused, and the vibration of stable frequency can be obtained. As will be appreciated, the present invention chooses a peculiar shape for the conversion of the vibration coming from the vibrational portion 2 into the flexural mode at the supporting portion 3, or the ratio of width to length of the flexural portion so that the vibration of the vibrational portion is made free and both the mass of a portion deformable in the flexural mode and that of a connecting portion are made large, and disposes the two supporting portions symmetrically at the central portions of the sides of the vibrational portion, thereby achieving the foregoing objects of the present invention. The structure of the present invention described above will be summarized as follows.

Figure 1A:
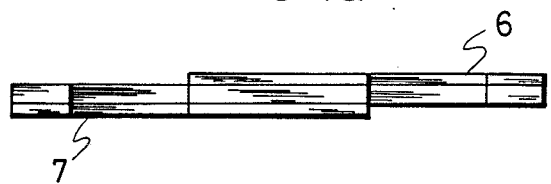
FIGS. 1a and 1b are a side view and a plane view, respectively, of an embodiment of a face shear mode quartz crystal resonator according to the present invention.
Figure 1B:
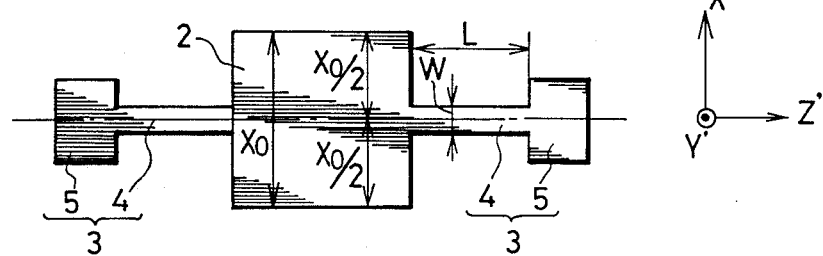
Figure 2A:
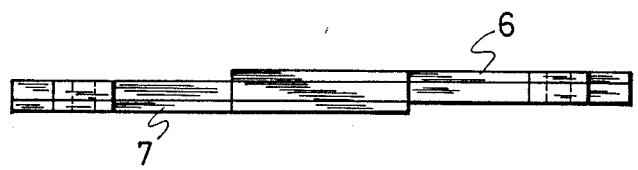
FIGS. 2a and 2b are a side view and a plan view, respectively, of another embodiment of the face shear mode quartz crystal resonator according to the present invention.
Figure 2B:
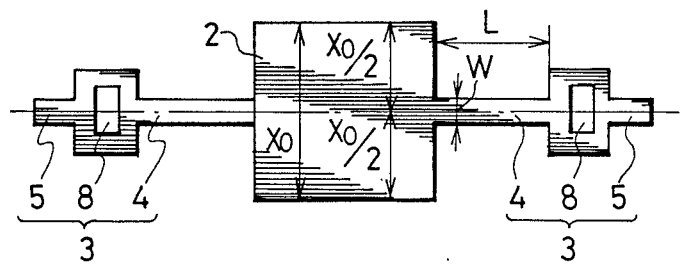

The face shear mode quartz crystal resonator has the vibrational portion and supporting portions incorporated therein by the etching method, which is characterized in that the flexural portions of the supporting portions are connected with the central portions of the sides of the vibrational portion, the width W of the flexural portion connected with the vibrational portion is smaller than 0.67 L, the supporting portions are provided at both edges in the z'-axis direction of the vibrational portion, the vibrational portion is substantially square whose each side is from 0.72 mm to 2.02 mm, and the vibrational portion is fixedly supported via both distal end portions of the supporting portions. FIG. 1 is a combination of a plan view and a side view of an embodiment of a face shear mode quartz crystal resonator according to the present invention. A resonator 1 comprises a vibrational portion 2 and supporting portions 3, electrodes 6 and 7 are disposed on the upper and under surfaces of the resonator 1, and these components are incorporated by an etching method. The supporting portion 3 has a flexural portion 4 whose width W is made smaller than 0.67 L where L represents the length. The reason of the foregoing limitation is that the vibration of the vibrational portion 2 can be made free without being suppressed. Further, a mounting portion 5 is provided in an end portion of the flexural portion 4 for the purpose of making small the energy loss caused by vibration, and this mounting portion 5 is secured by soldering or by means of a bonding agent or the like. Here, since the supporting portions 3 are aligned in the z'-axis direction, even if they are mounted to a body of ceramics, the material of the supporting portions is substantially identical in the value of the thermal expansion coefficient with ceramics the z'-axis direction; consequently, even when the temperature changes, no stress is imposed on the resonator, thereby resulting in a stable frequency characteristic. Further, the flexural portion 4 is connected with a central portion of the side of length $x_o$ of the vibrational portion 2. With the foregoing configuration, the energy loss caused by vibration can be reduced further. FIG. 2 is a combination of a plan view and a side view of another embodiment of the face shear mode quartz crystal resonator according to the present invention. A resonator 1 has electrodes 6 and 7 disposed on the upper and under surfaces thereof, and comprises a vibrational portion 2 and supporting portions 3, these components being incorporated by the etching method. The supporting portion 3 comprises a flexural portion 4 and a mounting portion 5, and the width W and length L of the flexural portion are designed so as to meet "$W \leq 0.67L$". The reason of the above is identical with that described with reference to the embodiment of FIG. 1. However, a hole 8 is formed between the flexural portion 4 and the mounting portion 5 so that the vibration of the flexural portion 4 does not transfer up to the mounting portion 5. Accordingly, even where the resonator is mounted via the mounting portions 5, there can be obtained the face shear mode quartz crystal resonator having a small energy loss caused by vibration and a small motional series resistance $R_1$. Further, since the flexural portion 4 is connected with a central portion of the side of length $x_o$ of the vibrational portion 2, the energy loss caused by vibration can be reduced more. Further, since both distal ends of the mounting portions 5 of the supporting portions 3 provided at both edges of the square vibrational portion 2 are mounted by soldering or by means of a bonding agent or the like, there can be obtained the quartz crystal resonator very resistant to shock.

As described above, the present invention has devised and improved the face shear mode quartz crystal resonator having the vibrational portion and supporting portions incorporated therein by the etching method, so that the following significant effects result:

① Since the vibration can be made free by devising and improving the shape and dimensions of the supporting portions, there is obtained the quartz crystal resonator having a small motional series resistance and a large quality factor.

② Since the vibrational portion and the supporting portions are incorporated by the etching method, the resonator can be minaturized.

③ At the same time, since the resonator is fixedly supported via the mounting portions of the supporting portions, it becomes excellent in shock-resistance.

④ Since the supporting portion is connected with the central portion of the side of the vibrational portion, the energy loss caused by vibration is small and the motional series resistance $R_1$ is reduced.

⑤ Since the resonator is secured to the pedestal made of, for example, ceramics via the mounting portion not influencing the vibration, the energy loss caused by vibration is lessened.

⑥ Since the resonator is thin and fixedly supported via its both distal ends, there can e fabricated a thin quartz crystal unit of the surface mounting type.

I claim:
1. A face shear mode quartz crystal resonator having a vibrational portion and supporting portions incorporated therein by and etching method, characterized in that a flexural portion of said supporting portion is connected with a central portion of a side of said vibrational portion, the width W of said flexural portion connected with said vibrational portion is smaller than 0.67 L (L is the length of said flexural portion), said supporting portions are provided at the edges in the z'-axis direction of said vibrational portion, said vibrational portion is substantially square, each side of said vibrational portion is from 0.72 mm to 2.02 mm, and said vibrational portion is fixedly supported via both distal end portions of said supporting portions.

* * * * *